(12) United States Patent
Park et al.

(10) Patent No.: US 9,057,954 B2
(45) Date of Patent: Jun. 16, 2015

(54) APPARATUS FOR CREATING AN EXTREME ULTRAVIOLET LIGHT, AN EXPOSING APPARATUS INCLUDING THE SAME, AND ELECTRONIC DEVICES MANUFACTURED USING THE EXPOSING APPARATUS

(71) Applicant: Samsung Electronics Co., Ltd., Suwon-si (KR)

(72) Inventors: Chang-Min Park, Hwaseong-si (KR); Joo-On Park, Seongnam-si (KR); Jeong-Ho Yeo, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/940,784

(22) Filed: Jul. 12, 2013

(65) Prior Publication Data
US 2014/0078480 A1 Mar. 20, 2014

(30) Foreign Application Priority Data
Sep. 17, 2012 (KR) .......................... 10-2012-0102755

(51) Int. Cl.
*G03F 7/20* (2006.01)
*H05G 2/00* (2006.01)

(52) U.S. Cl.
CPC .............. *G03F 7/2006* (2013.01); *H05G 2/006* (2013.01); *H05G 2/008* (2013.01); *H05G 2/003* (2013.01); *G03F 7/70916* (2013.01); *G03F 7/20* (2013.01)

(58) Field of Classification Search
CPC ....... H05G 2/006; H05G 2/003; H05G 2/008; G03F 7/70916

USPC ...................................................... 250/504 R
See application file for complete search history.

(56) References Cited

U.S. PATENT DOCUMENTS

| 4,663,567 | A  | * | 5/1987  | Wong ........................ 315/111.21 |
| 6,469,310 | B1 | * | 10/2002 | Fiedorowicz et al. ... 250/492.22 |
| 6,493,423 | B1 | * | 12/2002 | Bisschops ..................... 378/119 |
| 6,661,018 | B1 | * | 12/2003 | McGregor et al. ........ 250/504 R |
| 6,738,452 | B2 | * | 5/2004  | McGregor et al. ............ 378/119 |
| 7,098,994 | B2 |   | 8/2006  | Moors et al. |
| 7,372,057 | B2 | * | 5/2008  | Gaebel et al. ............. 250/504 R |
| 7,405,416 | B2 | * | 7/2008  | Algots et al. ............... 250/493.1 |
| 7,655,925 | B2 |   | 2/2010  | Bykanov et al. |
| 7,750,327 | B2 |   | 7/2010  | Tran et al. |

(Continued)

FOREIGN PATENT DOCUMENTS

| JP | 2007220949      | 8/2007 |
| KR | 1020050075716   | 7/2005 |
| KR | 1020100057851   | 6/2010 |

Primary Examiner — Michael Logie
Assistant Examiner — Wyatt Stoffa
(74) Attorney, Agent, or Firm — Onello & Mello, LLP

(57) ABSTRACT

An apparatus for creating an EUV light may include a droplet-supplying unit, a laser-irradiating unit, a light-concentrating unit and a guiding unit. The droplet-supplying unit may supply a droplet from which the EUV light may be created. The laser-irradiating unit may irradiate a laser to the droplet supplied from the droplet-supplying unit to create the EUV light. The light-concentrating unit may concentrate the EUV light created by the laser-irradiating unit. The guiding unit may guide the droplet to a position at which the laser may be irradiated. The guiding unit may have at least one gas-spraying hole for spraying a gas to a space between the droplet-supplying unit and the laser irradiation position to form a gas curtain configured to surround the droplet.

22 Claims, 10 Drawing Sheets

(56) References Cited

U.S. PATENT DOCUMENTS

| | | | |
|---|---|---|---|
| 7,838,854 B2 * | 11/2010 | Algots et al. | 250/504 R |
| 7,872,245 B2 * | 1/2011 | Vaschenko et al. | 250/492.2 |
| 8,198,615 B2 | 6/2012 | Bykanov et al. | |
| 8,263,953 B2 * | 9/2012 | Fomenkov et al. | 250/504 R |
| 8,507,882 B2 * | 8/2013 | Swinkels et al. | 250/504 R |
| 2001/0006217 A1 * | 7/2001 | Bisschops | 250/493.1 |
| 2002/0162974 A1 * | 11/2002 | Orsini et al. | 250/504 R |
| 2003/0223546 A1 * | 12/2003 | McGregor et al. | 378/143 |
| 2005/0157284 A1 | 7/2005 | Moors et al. | |
| 2006/0138354 A1 * | 6/2006 | Bakker et al. | 250/492.21 |
| 2006/0192154 A1 * | 8/2006 | Algots et al. | 250/504 R |
| 2007/0023706 A1 * | 2/2007 | Sjmaenok et al. | 250/504 R |
| 2007/0170377 A1 * | 7/2007 | Nakano | 250/504 R |
| 2008/0067456 A1 * | 3/2008 | Kloepfel et al. | 250/504 R |
| 2009/0057567 A1 | 3/2009 | Bykanov et al. | |
| 2009/0127479 A1 | 5/2009 | Hosokai et al. | |
| 2009/0230326 A1 * | 9/2009 | Vaschenko et al. | 250/492.2 |
| 2010/0053581 A1 * | 3/2010 | Swinkels et al. | 355/53 |
| 2010/0140514 A1 | 6/2010 | Bykanov et al. | |
| 2010/0181498 A1 * | 7/2010 | Someya et al. | 250/492.1 |
| 2010/0258748 A1 * | 10/2010 | Vaschenko et al. | 250/504 R |
| 2011/0248191 A1 * | 10/2011 | Fomenkov et al. | 250/504 R |
| 2012/0205559 A1 * | 8/2012 | Yabu et al. | 250/504 R |
| 2012/0280149 A1 * | 11/2012 | Mestrom et al. | 250/492.1 |
| 2012/0305810 A1 | 12/2012 | Ershov et al. | |

\* cited by examiner

APPARATUS FOR CREATING AN EXTREME ULTRAVIOLET LIGHT, AN EXPOSING APPARATUS INCLUDING THE SAME, AND ELECTRONIC DEVICES MANUFACTURED USING THE EXPOSING APPARATUS

CROSS-RELATED APPLICATION

This U.S. non-provisional application claims priority under 35 USC §119 to Korean Patent Application No. 2012-102755, filed on Sep. 17, 2012 in the Korean Intellectual Property Office (KIPO), the contents of which are herein incorporated by reference in their entirety.

BACKGROUND

1. Field

The present inventive concepts relate to an apparatus for creating an extreme ultraviolet light, an exposing apparatus including the same, and an electronic device manufactured using the exposing apparatus. More particularly, example embodiments of the present inventive concepts relate to an apparatus for creating an extreme ultraviolet light using a laser, an apparatus for exposing a layer on a substrate using the ultraviolet light created by the apparatus, and an electronic device manufactured using the exposing apparatus.

2. Description of the Related Art

As a design rule of a semiconductor device has been greatly reduced, a wavelength of a light used in an exposing process has also be shortened. There may be difficulties forming a desired pattern having a minute width using a light source such as, for example, an I-line, a G-line, a KrF, an ArF, or the like. Thus, an extreme ultraviolet (EUV) light having a short wavelength may be used in the exposing process.

The EUV light may be created using an apparatus for creating the EUV light. The apparatuses for creating the EUV light may be classified as a discharge produced plasma (DPP) type apparatus or a laser produced plasma (LPP) type apparatus.

The DPP type apparatus may create the EUV light from high-density plasma formed by applying a high voltage to a droplet. The LPP type apparatus may create the EUV light from high-density plasma formed by irradiating a laser onto a droplet.

SUMMARY

Example embodiments of the present inventive concepts provide an apparatus for creating an EUV light that is capable of preventing a droplet from being shaken so that a laser may be accurately irradiated to the droplet. In addition, example embodiments of the present inventive concepts provide an apparatus for creating an EUV light that is capable of preventing contaminations of a light-concentrating unit.

Example embodiments of the present inventive concepts also provide an exposing apparatus for performing an exposing process using the EUV light created by the apparatus for creating an EUV light.

Example embodiments of the present inventive concepts also provide electronic devices manufactured using the exposing apparatus.

According to an aspect of the present inventive concepts, an apparatus for creating an EUV light is provided. The apparatus for creating the EUV light may include a droplet-supplying unit, a laser-irradiating unit, a light-concentrating unit and a guiding unit. The droplet-supplying unit may supply a droplet from which the EUV light may be created. The laser-irradiating unit may irradiate a laser to the droplet supplied from the droplet-supplying unit to create the EUV light. The light-concentrating unit may concentrate the EUV light created by the laser-irradiating unit. The guiding unit may guide the droplet to a position at which the laser may be irradiated. The guiding unit may have at least one gas-spraying hole for spraying a gas to a space between the droplet-supplying unit and the laser irradiation position to form a gas curtain to surround the droplet.

In some embodiments, the guiding unit may have a passageway through which the droplet may pass.

In some embodiments, the gas-spraying hole may be along the guiding unit such that the passageway may be surrounded by the gas curtain.

In some embodiments, the gas-spraying hole may include a plurality of holes spaced apart from each other by a uniform interval.

In some embodiments, the gas-spraying hole may include a single hole extended along a lengthwise direction of the guiding unit.

In some embodiments, the guiding unit may have a shape configured to fully surround the passageway.

In some embodiments, the guiding unit may have one of a rectangular frame cross-sectional shape and an annular cross-sectional shape.

In some embodiments, the guiding unit may have a shape configured to partially surround the passageway for exposing a portion of the passageway that may be opposite to the light-concentrating unit.

In some embodiments, the creating apparatus may further include a gas-spraying unit for spraying a gas from the light-concentrating unit to the droplet to prevent particles generated from the droplet from being adhered to the light-concentrating unit.

In some embodiments, the gas sprayed from the gas-spraying unit may have a pressure lower than the pressure of the gas sprayed from the gas-spraying hole.

In some embodiments, the guiding unit and the droplet-supplying unit may be arranged substantially parallel to each other. The droplet-supplying unit and the laser-irradiating unit may be arranged substantially perpendicular to each other.

In some embodiments, the light-concentrating unit may be positioned between the laser-irradiating unit and the position where the laser is irradiated.

According to another aspect of the present inventive concepts, an apparatus for creating an EUV light is provided. The apparatus for creating the EUV light may include a droplet-supplying unit, a laser-irradiating unit, a light-concentrating unit, a gas-spraying unit and a guiding unit. The droplet-supplying unit may supply a droplet from which the EUV light may be created in a first direction. The laser-irradiating unit may irradiate a laser in a second direction substantially perpendicular to the first direction to the droplet supplied from the droplet-supplying unit to create the EUV light. The light-concentrating unit may be between the laser-irradiating unit and a position at which the laser may be irradiated to concentrate the EUV light created by the laser-irradiating unit. The gas-spraying unit may spray a first gas in the second direction from the light-concentrating unit to the droplet to prevent particles generated from the droplet from being adhered to the light-concentrating unit. The guiding unit may have a passageway for guiding the droplet to the laser irradiation position, and at least one gas-spraying hole arranged around the passageway for spraying a second gas in the first direction to form a gas curtain that may be configured to block off the first gas from a flow of the droplet.

In some embodiments, the guiding unit may have a shape configured to fully surround the passageway.

In some embodiments, the guiding unit may have a shape configured to partially surround the passageway for exposing a portion of the passageway that may be oriented opposite to the light-concentrating unit.

In some embodiments, the first gas may have a pressure lower than that of the second gas.

According to another aspect of the present inventive concepts, an exposing apparatus is provided. The exposing apparatus may include an apparatus for creating an EUV light, an illuminating optical unit and projecting optical unit. The apparatus for creating the EUV light may include a droplet-supplying unit, a laser-irradiating unit, a light-concentrating unit and a guiding unit. The droplet-supplying unit may supply a droplet from which the EUV light may be created. The laser-irradiating unit may irradiate a laser to the droplet supplied from the droplet-supplying unit to create the EUV light. The light-concentrating unit may concentrate the EUV light created by the laser-irradiating unit. The guiding unit may guide the droplet to a position at which the laser may be irradiated. The guiding unit may have at least one gas-spraying hole for spraying a gas to a space between the droplet-supplying unit and the laser irradiation position to form a gas curtain that may block off the first gas from a flow of the droplet. The illuminating optical unit may project the EUV light created from the apparatus for creating the EUV light to a mask. The projecting optical unit may project a reflected EUV light from the mask to a substrate.

In some embodiments, the exposing apparatus may further include a mask stage arranged over the illuminating optical unit to support the mask.

In some embodiments, the exposing apparatus may further include a substrate stage arranged under the illuminating optical unit to support the substrate.

According to another aspect of the present inventive concepts, an exposing apparatus is provided. The exposing apparatus may include an apparatus for creating an EUV light, an illuminating optical unit and projecting optical unit. The apparatus for creating the EUV light may include a droplet-supplying unit, a laser-irradiating unit, a light-concentrating unit, a gas-spraying unit and a guiding unit. The droplet-supplying unit may supply a droplet from which the EUV light may be created in a first direction. The laser-irradiating unit may irradiate a laser in a second direction substantially perpendicular to the first direction to the droplet supplied from the droplet-supplying unit to create the EUV light. The light-concentrating unit may be between the laser-irradiating unit and a position at which the laser may be irradiated to concentrate the EUV light created by the laser-irradiating unit. The gas-spraying unit may spray a first gas in the second direction from the light-concentrating unit to the droplet to prevent particles generated from the droplet from being adhered to the light-concentrating unit. The guiding unit may have a passageway for guiding the droplet to the laser irradiation position, and at least one gas-spraying hole arranged around the passageway for spraying a second gas in the first direction to form a gas curtain that may be configured to block off the first gas from a flow of the droplet. The illuminating optical unit may project the EUV light created from the apparatus for creating the EUV light to a mask. The projecting optical unit may project a reflected EUV light from the mask to a substrate.

In some embodiments, the exposing apparatus may further include a mask stage arranged over the illuminating optical unit to support the mask.

In some embodiments, the exposing apparatus may further include a substrate stage arranged under the illuminating optical unit to support the substrate.

According to another aspect of the present inventive concepts, electronic devices are provided. The electronic devices may be manufactured using any one of the exposing apparatuses.

In some embodiments, the electronic devices may include one of a semiconductor device and a display device.

According to another aspect of the present inventive concepts, an apparatus for creating an extreme ultraviolet (EUV) light is provided. The apparatus for creating the EUV light may include a droplet-supplying unit supplying a droplet in a first direction, a laser-irradiating unit irradiating a laser in a second direction to the droplet to create the EUV light, a light-concentrating unit concentrating the EUV light, and a guiding unit having a passageway and at least one gas-spraying hole. The passageway in the guiding unit guides the droplet to a position where the laser irradiated, and the gas-spraying hole at least partially surrounds the passageway to spray a gas in the first direction forming a gas curtain to surround the droplet.

In some embodiments, the second direction is substantially perpendicular to the first direction.

In some embodiments, the gas-spraying hole has a plurality of holes spaced apart from each other by a uniform interval.

In some embodiments, the gas-spraying hole has a single hole extended in a lengthwise direction of the guiding unit.

In some embodiments, the apparatus for creating the EUV light further includes a gas-spraying unit for spraying a gas from the light-concentrating unit to the droplet to prevent particles generated from the droplet from being adhered to the light-concentrating unit.

According to some example embodiments of the present inventive concepts, a gas sprayed from a gas-spraying hole of a guiding unit may form the gas curtain configured to surround the flow of the droplet. Thus, the droplet may be accurately guided to a laser irradiation position. Further, the gas curtain may block movements of the particles generated from the droplet, so that the light-concentrating unit may not be contaminated by the particles. Particularly, because the gas sprayed from the gas-spraying unit does not enter into the gas curtain, turbulences causing the droplet to shake may not be generated. As a result, the gas sprayed from the gas-spraying unit may only prevent the movements of the particles toward the light-concentrating unit without creating turbulence.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
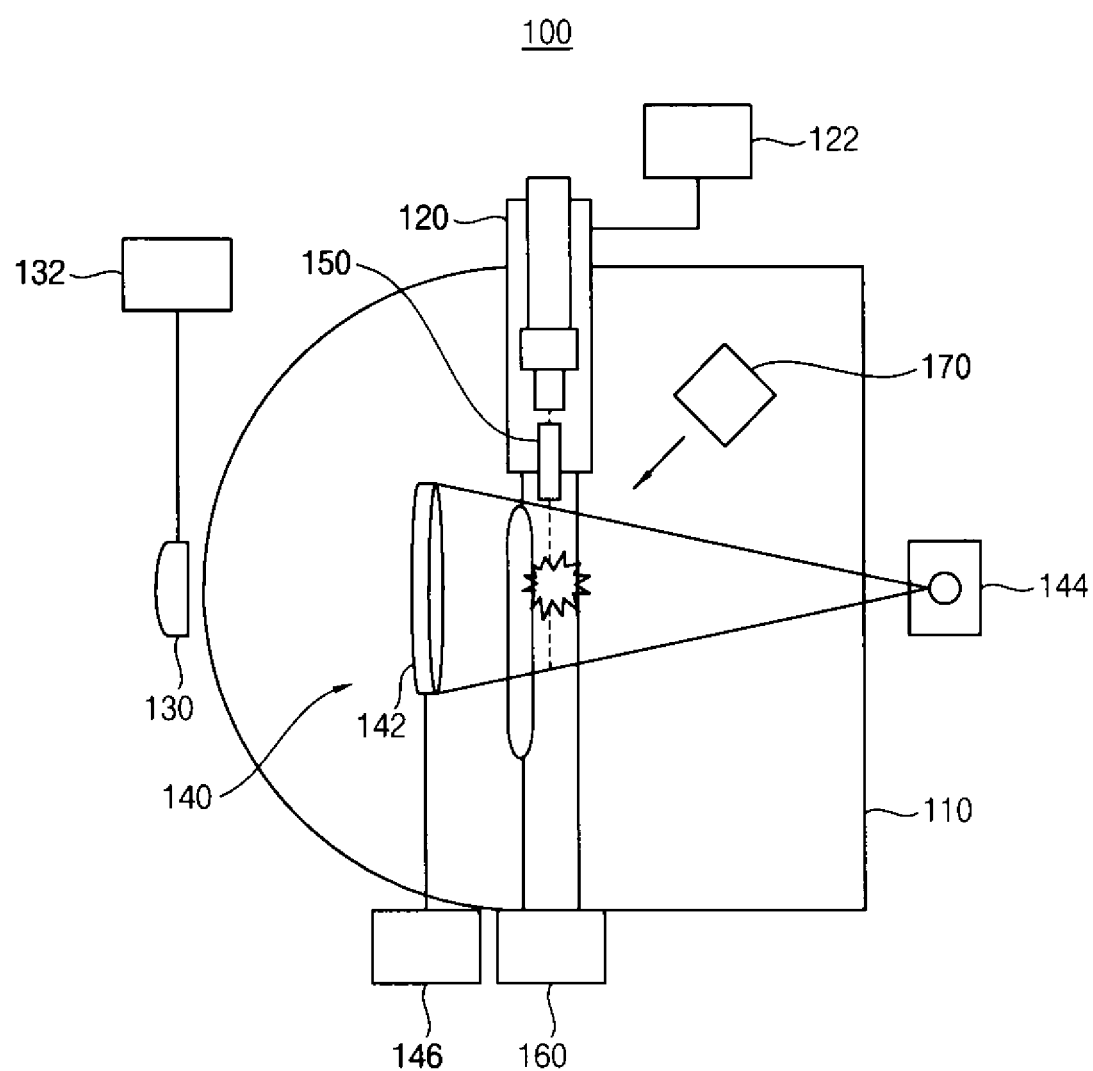
FIG. 1 is a cross-sectional view illustrating an apparatus for creating an EUV light in accordance with example embodiments of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Hereinafter, example embodiments will be explained in detail with reference to the accompanying drawings.

An LPP type apparatus for creating the EUV light may include a droplet-supplying unit, a laser-irradiating unit, a light-concentrating unit, a guiding unit and a gas-spraying unit. The droplet-supplying unit may supply a droplet such as tin (Sn). The laser-irradiating unit may irradiate a laser to the droplet to create the EUV light. The light-concentrating unit may concentrate the created EUV light on a predetermined position. The guiding unit may guide the droplet to a laser irradiation point. The gas-spraying unit may spray a gas to the droplet to prevent particles generated from the droplet from being adhered to the light-concentrating unit.

The gas-spraying unit may spray the gas to the droplet located at the laser irradiation position. The sprayed gas may have influence on a position of the droplet to which the gas may be sprayed. In order to suppress the influence of the sprayed gas on the position of the droplet, the guiding unit may have a long length. The gas sprayed toward the droplet may be blocked by the long guiding unit. However, the sprayed gas may not sufficiently prevent the particles generated from the droplet from being moved toward the light-concentrating unit.

When the guiding unit has a short length, a sufficiently amount of the gas may be sprayed to the droplet, so that movements of the particles toward the light-concentrating unit may be suppressed. However, a large amount of the gas may result in turbulence, and, thus, the droplet may be shaken. Because the laser may be accurately irradiate to the shaken droplet, a desired amount of the EUV light may not be created.

Apparatus for Creating an EUV Light

Figure 2:
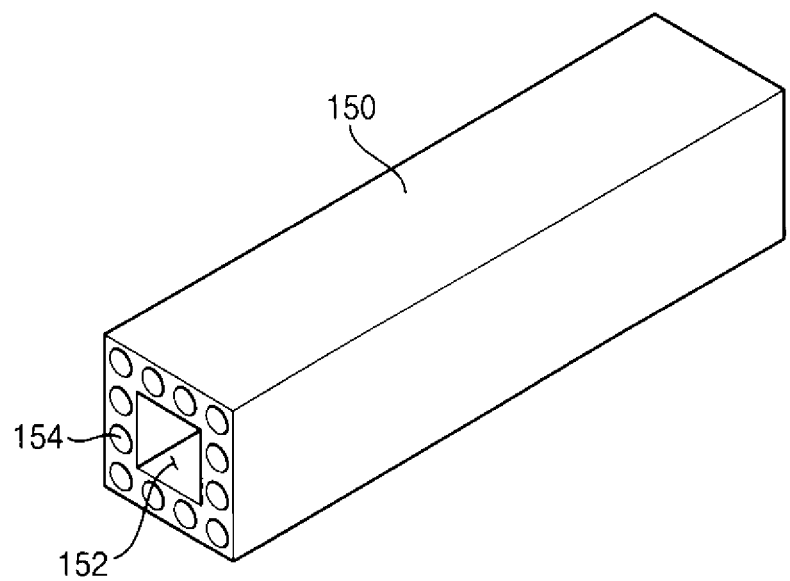
FIG. 2 is an enlarged perspective view illustrating a guiding unit of the apparatus for creating the EUV light of FIG. 1.
Figure 3:
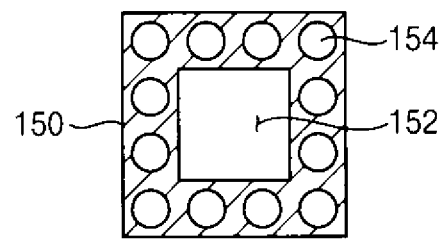
FIG. 3 is a bottom perspective view illustrating the guiding unit of the apparatus for creating the EUV light of FIG. 2.

FIG. 1 is a cross-sectional view illustrating an apparatus for creating an EUV light in accordance with example embodiments, FIG. 2 is an enlarged perspective view illustrating a guiding unit of the apparatus for creating the EUV light of FIG. 1, and FIG. 3 is a bottom view illustrating the guiding unit of FIG. 2.

Referring to FIG. 1, an apparatus 100 for creating an EUV light in accordance with the example embodiment of FIG. 1 may include a chamber 110, a droplet-supplying unit 120, a laser-irradiating unit 130, a light-concentrating unit 140 and a guiding unit 150.

The chamber 110 may have an inner space in which the EUV light may be created. In some example embodiments, the EUV light may be created from plasma having a high temperature formed by irradiating a laser to a droplet. Thus, the chamber 110 may include a material that may not be damaged by the plasma having the high temperature.

The droplet-supplying unit 120 may be arranged at an upper surface of the chamber 110. The droplet-supplying unit 120 may supply the droplets one-by-one to the inner space of the chamber 110 in a first direction. In some example embodiments, the first direction may correspond to a vertical downward direction. Therefore, the droplets may be supplied from the droplet-supplying unit to the inner space of the chamber 110 in the vertical downward direction. The droplet may include, for example, tin (Sn), tin compound, or the like.

The laser-irradiating unit 130 may be arranged at a left side surface of the chamber 110. The laser-irradiating unit 130 may irradiate the laser to the inner space of the chamber 110 in a second direction substantially perpendicular to the first direction. In some example embodiments, the second direction may correspond to a horizontal right direction. Thus, the laser-irradiating unit 130 may be arranged substantially perpendicular to the droplet-supplying unit 120. The laser may include a carbon-dioxide laser.

In order to accurately irradiate the laser to the droplet, which may be moved in the first direction, in the second direction, a laser-controlling unit 132 may control positions of the laser-irradiating unit 130. In some example embodiments, the laser-controlling unit 132 may minutely move the laser-irradiating unit 130 in an X-axis direction, a Y-axis direction and/or a Z-axis direction.

The laser may be accurately irradiated to the droplet under a condition that the laser may be irradiated in a horizontal line corresponding to the second direction and the droplet may be positioned on a vertical line corresponding to the first direction. The laser irradiated from the laser-irradiating unit 130 may have straightforwardness, so that the laser-irradiating unit 130 may accurately irradiate the laser in the horizontal line. In contrast, although the droplet-supplying unit 120 may be accurately positioned on the vertical line, the droplet entering into the inner space of the chamber 110 may be minutely moved by external environments, as noted above. When the droplet may be slightly offset from the vertical line, the laser may not be accurately irradiated to the offset droplet.

The light-concentrating unit 140 may concentrate the EUV light created by irradiating the laser to the droplet. In some example embodiments, the light-concentrating unit 140 may include a light-concentrating mirror 142 and a light-collecting member 144. The light-concentrating mirror 142 may be arranged in the inner space of the chamber 110 between the laser-irradiating unit 130 and a position at which the laser may be irradiated. The light-concentrating mirror 142 may reflect the EUV light toward a right side surface of the chamber 110. The light-collecting member 144 may be arranged at the right side surface of the chamber 110. The light-collecting member 144 may be external to the chamber 110. While described as a right side and a left side, the present inventive concepts are not limited thereto. The EUV light reflected from the light-concentrating mirror 142 may be collected in the light-collecting member 144.

In order to accurately reflect the EUV light from the light-concentrating mirror 142 toward the light-collecting member 144, a mirror-controlling unit 146 may control positions of the light-concentrating mirror 142. The mirror-controlling unit 146 may control reflecting angles of the light-concentrating mirror 142 to focus the EUV light reflected from the light-concentrating mirror 142 on the light-collecting member 144.

The guiding unit 150 may guide the droplet supplied from the droplet-supplying unit 120 to the laser irradiation position. The guiding unit 150 may correspond to a gas shroud of the apparatus 100 for creating the EUV light. The guiding unit 150 may be arranged on a lower end of the droplet-supplying unit 120 through which the droplet may be discharged. The guiding unit 150 may be arranged in the first direction. The guiding unit 150 may be substantially parallel to the droplet-supplying unit 120.

Referring to FIGS. 2 and 3, the guiding unit 150 may have a rectangular parallelepiped shape. The guiding unit 150 may have a passageway 152 formed in the guiding unit 150 along a lengthwise direction of the guiding unit 150, that is, the vertical direction. The guiding unit 150 may have a rectangular frame shape.

The passageway 152 may be in fluidic communication with the lower end of the droplet-supplying unit 120. Thus, the droplet supplied from the droplet-supplying unit 120 may be guided to the laser irradiation position along the passageway 152 of the guiding unit 150. The droplet passing through the passageway 152 of the guiding unit 150 may be positioned in a space under the passageway 152. Particularly, the space under the passageway 152 may be surrounded by a virtual guiding unit downwardly extended from the guiding unit 150. Therefore, because the droplet may be moved along the vertical line in the space under the passageway 152, the laser emitted from the laser-irradiating unit 130 may be accurately irradiated to the droplet.

The guiding unit 150 may have gas-spraying holes 154. A gas may be sprayed from the gas-spraying holes 154 to form a gas curtain. In some example embodiments, the gas may include an inert gas such as a hydrogen gas, a nitrogen gas, or the like. The gas curtain may be configured to surround the droplet discharged from the droplet-supplying unit 120. Thus, the gas curtain may block the discharged droplet from the external environments. As a result, minute shakes of the discharged droplet may be suppressed by the gas curtain formed by the gas sprayed from the gas-spraying holes 154.

In some example embodiments, the gas-spraying holes 154 may be arranged along the guiding unit 150 separated by a minute interval. The gas-spraying holes 154 may be spaced apart from each other by a uniform interval. Because the guiding unit 150 may have the rectangular frame cross-section, the gas curtain, which may be formed by the gas sprayed from the gas-spraying holes 154, may also have a rectangular frame cross-section. The gas may not be sprayed from portions of the guiding unit 150 between the gas-spraying holes 154. Thus, the gas curtain may have vertical chinks. That is, the gas curtain may not be a continuously closed loop shape in a horizontal direction. However, because the gas-spraying holes 154 may be minutely arranged, the vertical chinks may have a very narrow width. Thus, the gas curtain having the vertical chinks may substantially block the discharged droplet from the external environments.

Additionally, a droplet catcher 160 may be arranged at a lower surface of the chamber 110. The droplet catcher 160 may continuously catch the droplets passing through the laser irradiation position.

Further, in order to detect the accurate irradiation of the laser to the droplet, a camera 170 for photographing the laser irradiation position may be arranged in the chamber 110.

Figure 4:
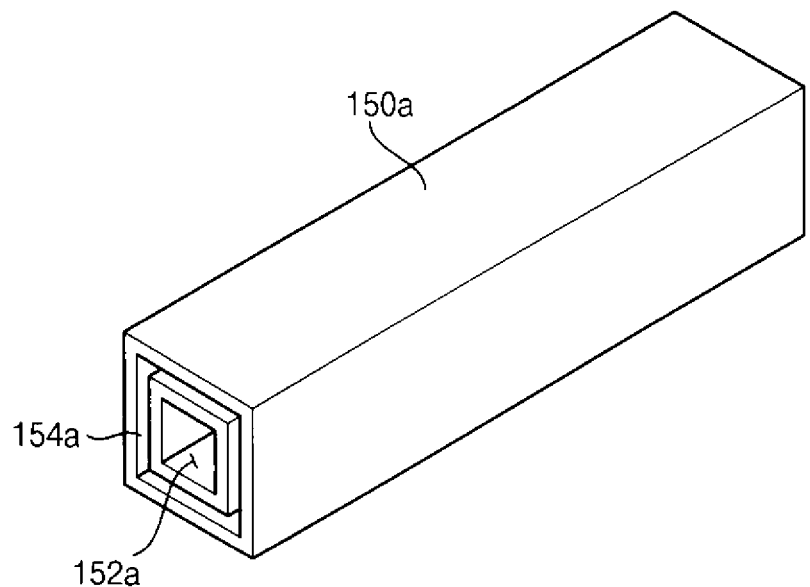
FIG. 4 is an enlarged perspective view illustrating a guiding unit of an apparatus for creating EUV light in accordance with example embodiments of the present inventive concepts.
Figure 5:
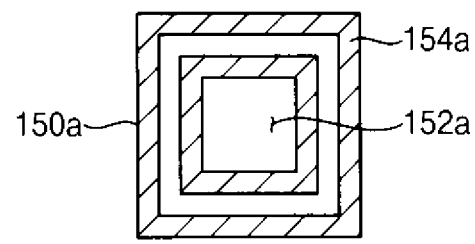
FIG. 5 is a bottom perspective view illustrating the guiding unit of the apparatus for creating the EUV light of FIG. 4.

FIG. 4 is an enlarged perspective view illustrating a guiding unit of an apparatus for creating EUV light in accordance with example embodiments of the present inventive concepts, and FIG. 5 is a bottom perspective view illustrating the guiding unit of FIG. 4.

Referring to FIGS. 4 and 5, a guiding unit 150a of the example embodiment of FIGS. 4 and 5 may have a rectangular parallelepiped passageway 152a and a single gas-spraying hole 154a.

In some example embodiments, the gas-spraying hole 154a may have a continuously connected rectangular frame shape. That is, the gas-spraying hole 154a may be a rectangular ring surrounding the passageway 152a spaced apart from the passageway 152a. The gas-spraying hole 154a may be between the outer edge of the guiding unit 150a and the passageway 152a. Thus, a gas sprayed from the gas-spraying hole 154a having the rectangular frame shape may form a gas curtain having a rectangular frame shape. Because the gas curtain having the rectangular frame shape does not have a discontinuous portion, the gas curtain may completely block the discharged droplet from the external environments.

Figure 6:
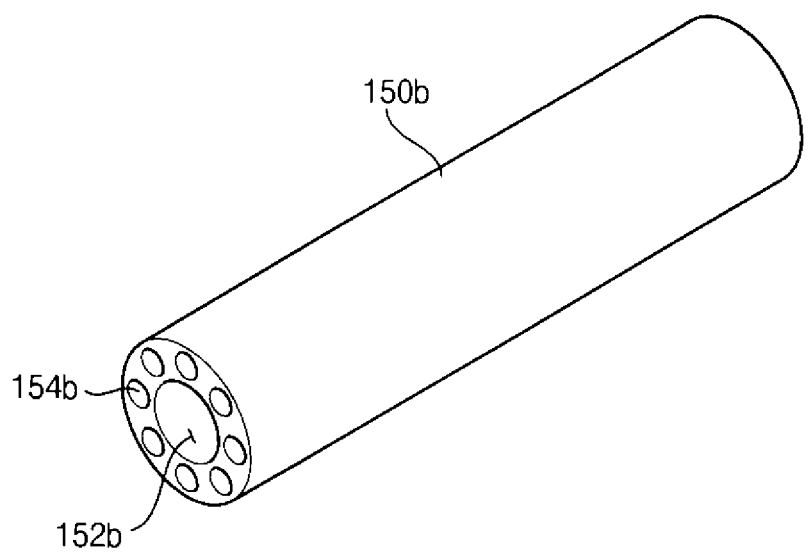
FIG. 6 is an enlarged perspective view illustrating a guiding unit of an apparatus for creating EUV light in accordance with example embodiments of the present inventive concepts.
Figure 7:
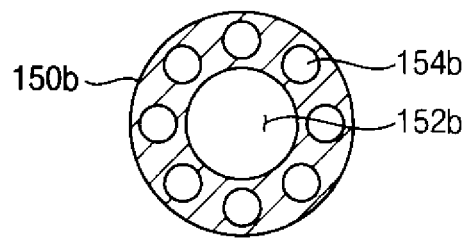
FIG. 7 is a bottom perspective view illustrating the guiding unit of the apparatus for creating the EUV light of FIG. 6.

FIG. 6 is an enlarged perspective view illustrating a guiding unit of an apparatus for creating EUV light in accordance with example embodiments of the present inventive concepts, and FIG. 7 is a bottom perspective view illustrating the guiding unit of FIG. 6.

Referring to FIGS. 6 and 7, a guiding unit 150b of the example embodiment of FIGS. 6 and 7 may have a cylindrical shape. Thus, the guiding unit 150b may have a cylindrical passageway 152b. Gas-spraying holes 154b may be annularly arranged at the cylindrical guiding unit 150b. The gas-spraying holes 154b may be arranged along the guiding unit 150b separated by a minute interval. The gas-spraying holes 154b may be spaced apart from each other by a uniform interval. Therefore, a gas sprayed from the annular gas-spraying holes 154b on the guiding unit 150b in a circumferential direction may form a cylindrical gas curtain.

The gas may not be sprayed from portions of the guiding unit 150b between the gas-spraying holes 154b. Thus, the gas curtain may have vertical chinks. That is, the gas curtain may not be a continuously closed loop shape in a horizontal direction. However, because the gas-spraying holes 154b may be minutely arranged, the vertical chinks may have a very narrow width. Thus, the gas curtain having the vertical chinks may substantially block the discharged droplet from the external environments.

Figure 8:
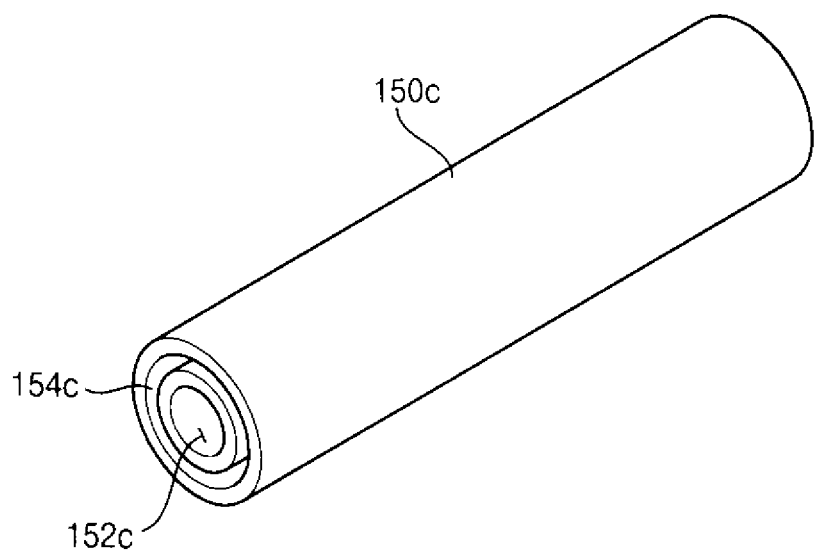
FIG. 8 is an enlarged perspective view illustrating a guiding unit of an apparatus for creating EUV light in accordance with example embodiments of the present inventive concepts.
Figure 9:
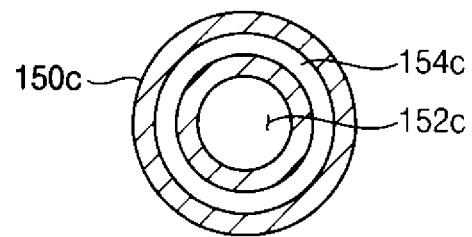
FIG. 9 is a bottom perspective view illustrating the guiding unit of the apparatus for creating the EUV light of FIG. 8.

FIG. 8 is an enlarged perspective view illustrating a guiding unit of an apparatus for creating EUV light in accordance with example embodiments of the present inventive concepts, and FIG. 9 is a bottom perspective view illustrating the guiding unit of FIG. 8.

Referring to FIGS. 8 and 9, a guiding unit 150c of the example embodiment of FIGS. 8 and 9 may have a cylindrical passageway 152c and a single gas-spraying hole 154c.

In some example embodiments, the gas-spraying hole 154c may have a continuously connected annular shape. That is, the gas-spraying hole 154c may be a circular ring surrounding the passageway 152c spaced apart from the passageway 152c. The gas-spraying hole 154c may be between the outer edge of the guiding unit 150c and the passageway 152c. Thus, a gas sprayed from the annular gas-spraying hole 154c may form a cylindrical gas curtain. Because the cylindrical gas curtain does not have a discontinuous portion, the cylindrical gas curtain may completely block the discharged droplet from the external environments.

Figure 10:
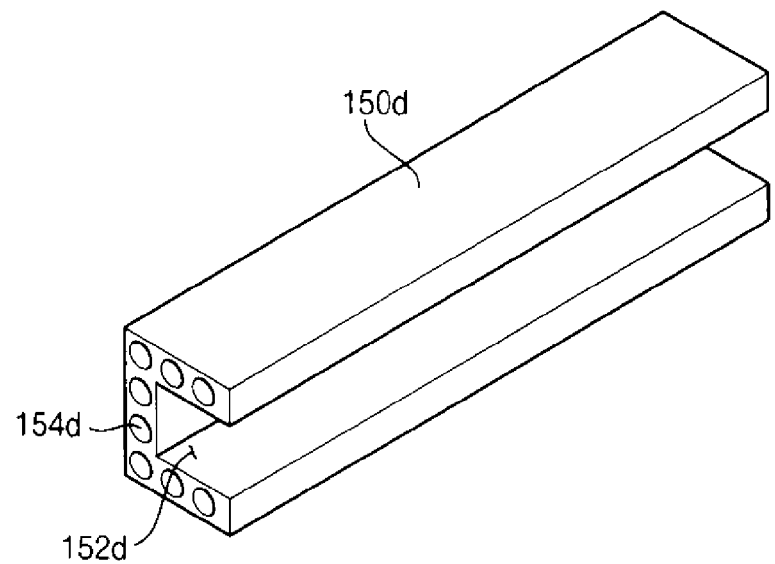
FIG. 10 is an enlarged perspective view illustrating a guiding unit of an apparatus for creating EUV light in accordance with example embodiments of the present inventive concepts.

FIG. 10 is an enlarged perspective view illustrating a guiding unit of an apparatus for creating EUV light in accordance with example embodiments of the present inventive concepts.

Referring to FIG. 10, a guiding unit 150d of the example embodiment of FIG. 10 may have a shape substantially the same as that of the guiding unit 150 in FIG. 2, except the guiding unit 150d does not have a right side surface.

Therefore, the guiding unit 150d may have a ⊂ shape, that is, a sideways U-shape with an opened right portion. Because the gas-spraying holes 154d may also have a ⊂ shape, a gas sprayed from the gas-spraying holes 154d may form a gas curtain having a ⊂ shape. Therefore, the guiding unit 150d of the example embodiment of FIG. 10 may have a rectangular frame cross-section having an opened right portion. Gas-spraying holes 154d may be arranged along the guiding unit 150d separated by a minute interval. The gas-spraying holes 154d may be spaced apart from each other by a uniform interval. Thus, a gas curtain formed by a gas sprayed from the gas-spraying holes 154d may have a rectangular frame cross-section having an opened right portion. The gas may not be sprayed from portions of the guiding unit 150d between the gas-spraying holes 154d. Thus, the gas curtain may have vertical chinks. However, because the gas-spraying holes 154d may be minutely arranged, the vertical chinks may have a very narrow width. Thus, the gas curtain having the vertical chinks may substantially block the discharged droplet from the external environments.

In some embodiments, a left side surface of the guiding unit 150d may be oriented toward the light-concentrating mirror 142. The particles generated from the droplet may be mainly adhered to the light-concentrating mirror 142. Thus, the guiding unit 150d may be provided with the left side surface.

The opened right side surface of the guiding unit 150d may be oriented toward the light-collecting member 144. In some example embodiments, in order to obtain a desired amount of the EUV light, it may be required to accurately concentrate the EUV light on the light-collecting member 144 by the light-concentrating mirror 142 as well as to accurately irradiate the laser to the droplet. Therefore, it may be required to locate the light-collecting member 144 at a focal position of the light-concentrating mirror 142.

The focal position of the light-concentrating mirror 142 may be determined in accordance with the reflecting angle of the light-concentrating mirror 142. Further, the focal position may also be determined in accordance with a refraction angle of the EUV light reflected from the light-concentrating mirror 142. Particularly, an accurate refraction angle of the EUV light may be inversely proportional to refraction numbers of the EUV light. Thus, in order to reduce the refraction numbers of the EUV light, it may be required to decrease interfaces of different materials between the light-concentrating mirror 142 and the light-collecting member 144.

The guiding unit 150d of the example embodiment of FIG. 10 may not have the right side surface, so that the gas curtain may also not have a right side surface. Thus, an interface of the gas curtain may not exist in the chamber 110. As a result, the refraction numbers of the EUV light may be relatively reduced, the light-collecting member 144 may be accurately located at the focal position of the light-concentrating mirror 142.

Figure 11:
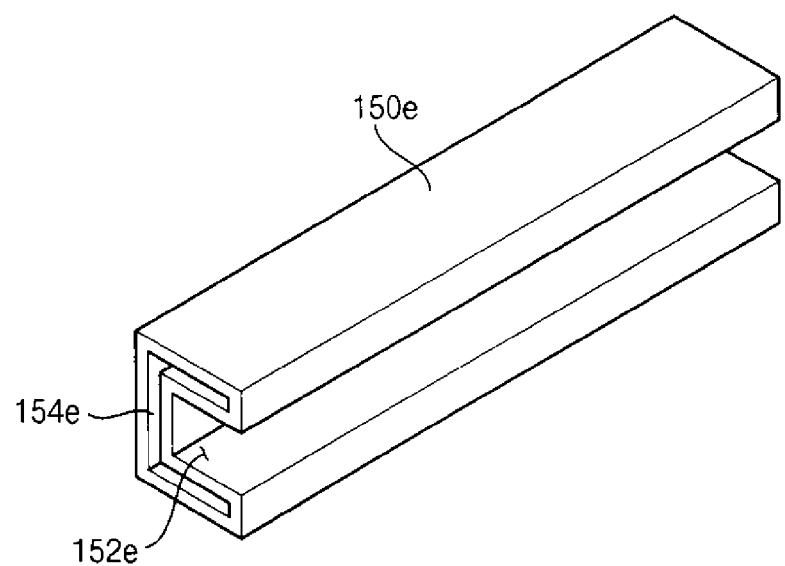
FIG. 11 is an enlarged perspective view illustrating a guiding unit of an apparatus for creating EUV light in accordance with example embodiments of the present inventive concepts.

FIG. 11 is an enlarged perspective view illustrating a guiding unit of an apparatus for creating EUV light in accordance with example embodiments of the present inventive concepts.

Referring to FIG. 11, a guiding unit 150e of the example embodiment of FIG. 11 may have a shape substantially the same as that of the guiding unit 150d in FIG. 10 except for a shape of a gas-spraying hole.

The gas-spraying hole 154e of the example embodiment of FIG. 11 may have a continuously connected ⊂ shape, that is, a sideways U-shape, having an opened right portion. A gas curtain formed by the gas-spraying hole 154e may completely block the discharged droplet from the light-concentrating mirror 142.

Figure 12:
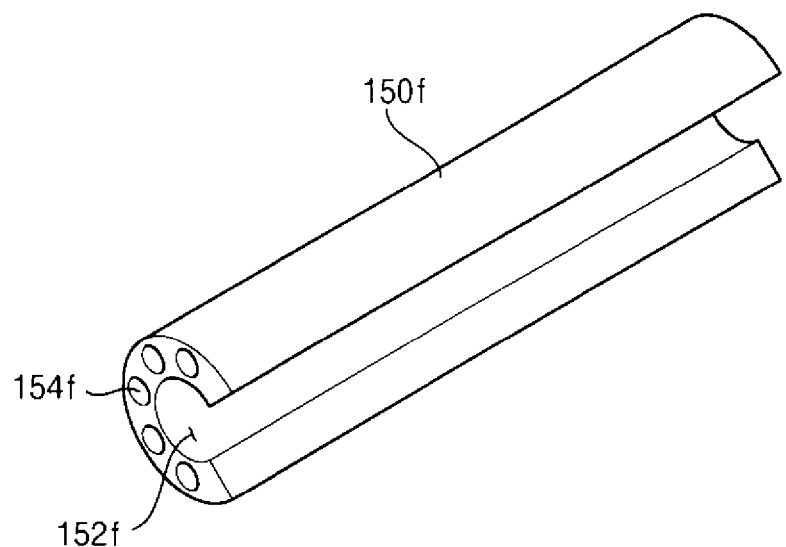
FIG. 12 is an enlarged perspective view illustrating a guiding unit of an apparatus for creating EUV light in accordance with example embodiments of the present inventive concepts.

FIG. 12 is an enlarged perspective view illustrating a guiding unit of an apparatus for creating EUV light in accordance with example embodiments of the present inventive concepts.

Referring to FIG. 12, a guiding unit 150f of the example embodiment of FIG. 12 may have a shape substantially the same as that of the guiding unit 150b in FIG. 6, except the guiding unit 150f does not have a right side portion.

Therefore, the guiding unit 150f of the example embodiment of FIG. 12 may have an annular shape having an opened right portion. Gas-spraying holes 154f may be arranged along the guiding unit 150f separated by a minute interval. The gas-spraying holes 154d may be spaced apart from each other by a uniform interval. Thus, a gas curtain formed by a gas sprayed from the gas-spraying hole 154f may have a cylindrical shape having an opened right portion. The gas may not be sprayed from portions of the guiding unit 150f between the gas-spraying holes 154f. Thus, the gas curtain may have vertical chinks. However, because the gas-spraying holes 154f may be minutely arranged, the vertical chinks may have a very narrow width. Thus, the gas curtain having the vertical chinks may substantially block the discharged droplet from the external environments.

The gas curtain may have a function substantially the same as that of the gas curtain in FIG. 10.

Figure 13:
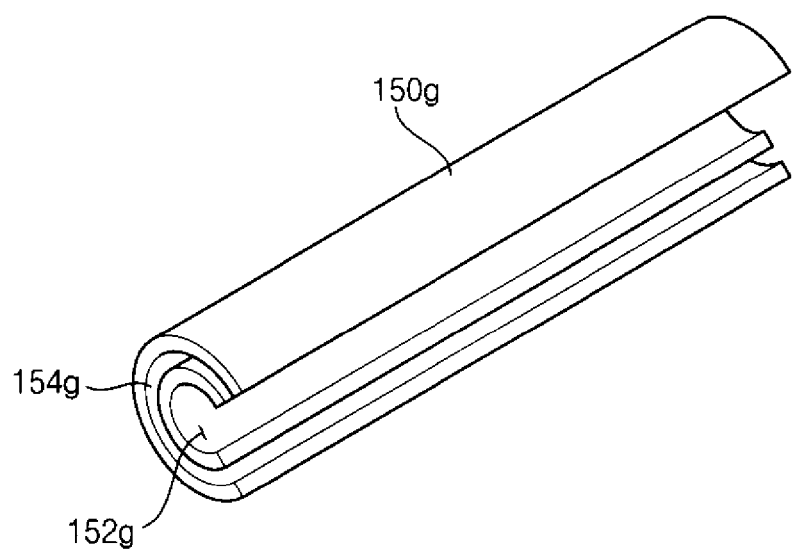
FIG. 13 is an enlarged perspective view illustrating a guiding unit of an apparatus for creating EUV light in accordance with example embodiments of the present inventive concepts.

FIG. 13 is an enlarged perspective view illustrating a guiding unit of an apparatus for creating EUV light in accordance with example embodiments of the present inventive concepts.

Referring to FIG. 13, a guiding unit 150g of the example embodiment of FIG. 13 may have a shape substantially the same as that of the guiding unit 150f in FIG. 12 except for a shape of a gas-spraying hole.

The gas-spraying hole 154g of this example embodiment may have a continuously connected annular shape having an opened right portion. Thus, a gas curtain formed by a gas sprayed from the gas-spraying hole 154g may completely block the discharged droplet from the light-concentrating mirror 142.

Figure 14:
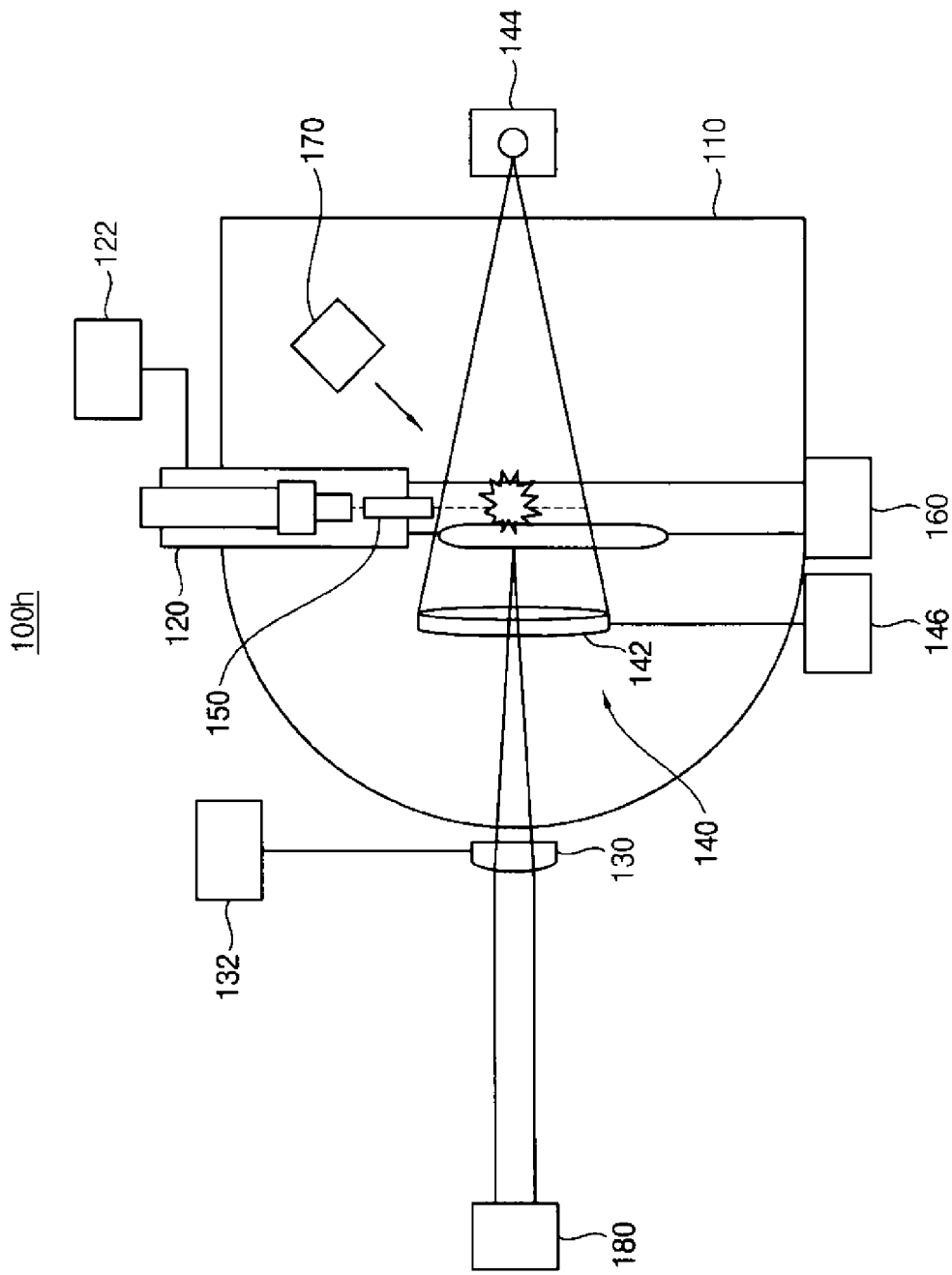
FIG. 14 is a cross-sectional view illustrating an apparatus for creating an EUV light in accordance with example embodiments of the present inventive concepts.

FIG. 14 is a cross-sectional view illustrating an apparatus 100h for creating an EUV light in accordance with example embodiments.

An apparatus 100h for creating the EUV light of the example embodiment of FIG. 14 may include elements substantially the same as those of the apparatus 100 for creating the EUV light of FIG. 1 except for further including a gas-spraying unit 180. Thus, the same reference numerals may refer to the same element and any further illustrations with respect to the same elements may be omitted herein for brevity.

Referring to FIG. 14, the apparatus 100h for creating the EUV light of the example embodiment of FIG. 14 may further include the gas-spraying unit 180. The gas-spraying unit 180 may spray a first gas to the laser irradiation position to prevent the light-concentrating mirror 142 from being contaminated by the particles generated from the droplet. Thus, the gas-spraying unit 180 may be arranged at the left side surface of the chamber 110 to spray the first gas from the light-concentrating mirror 142 to the light-collecting member 144, that is, along the second direction.

In some example embodiments, the gas curtain, which may be formed by the second gas sprayed from the guiding unit 150, may suppress the movements of the particles toward the light-concentrating mirror 142. However, the movements of the particles toward the light-concentrating mirror 142 may not be completely prevented using only the gas curtain. In order to prevent a very tiny amount of the particles from being adhered to the light-concentrating mirror 142, the gas-spraying unit 180 may spray the first gas in the second direction. The first gas may include an inert gas such as a hydrogen gas, nitrogen gas, or the like. The inert gas in a single tank may be supplied to the guiding unit 150 and the gas-spraying unit 180. Alternatively, the inert gases in two separate tanks may be supplied to the guiding unit 150 and the gas-spraying unit 180, respectively.

In some example embodiments, when the first gas sprayed from the gas-spraying unit 180 enters into the gas curtain, turbulence may be formed in the gas curtain. The turbulence may shake the droplets in the gas curtain. As mentioned above, as a result, the laser may not be accurately irradiated to the shaken droplet. Thus, it may be required to prevent the first gas from entering into the gas curtain.

In order to prevent the first gas from entering into the gas curtain, the first gas may have a pressure lower than that of the second gas. That is, the pressure of the first gas sprayed from the gas-spraying unit 180 may be lower than the pressure of the second gas sprayed from the guiding unit 150. As a result, the first gas may not enter into the gas curtain, so that the generation of the turbulence in the gas curtain may be suppressed.

In some example embodiments, the apparatus 100h for creating may include the guiding unit 150 in FIG. 2. Alternatively, the apparatus 100h for creating the EUV light may include any one of the guiding unit 150a in FIG. 4, the guiding unit 150b in FIG. 6, the guiding unit 150c in FIG. 8, the guiding unit 150d in FIG. 10, the guiding unit 150e in FIG. 11, the guiding unit 150f in FIG. 12 and the guiding unit 150g in FIG. 13.

Figure 15:
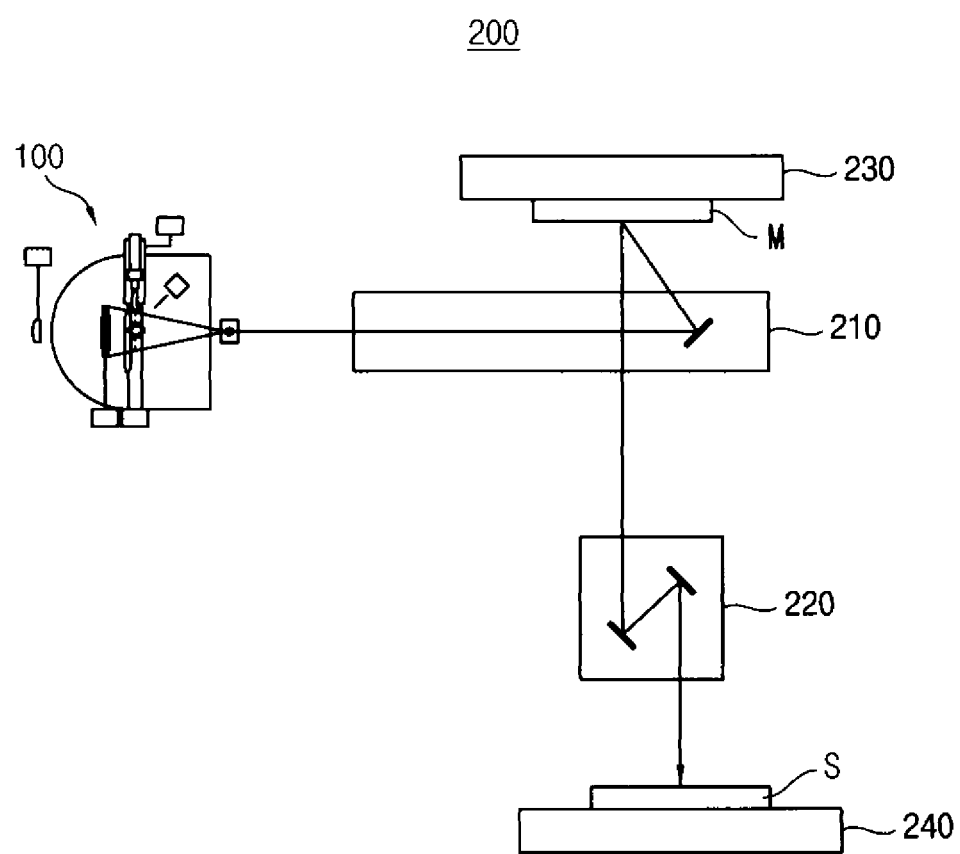
FIG. 15 is a plan view illustrating an exposing apparatus including the apparatus for creating the EUV light of FIG. 1.

FIG. 15 is a plan view illustrating an exposing apparatus including the apparatus 100 for creating the EUV light of FIG. 1.

Referring to FIG. 15, an exposing apparatus 200 of the example embodiment of FIG. 15 may include the apparatus 100 for creating the EUV light, an illuminating optical unit 210 and a projecting optical unit 220.

In some example embodiments, the apparatus 100 for creating the EUV light may include elements substantially the same as those of the apparatus 100 for creating the EUV light of FIG. 1. Thus, the same reference numerals may refer to the same elements and any further illustrations with respect to the same elements may be omitted herein for brevity.

The creating apparatus 100 may include any one of the guiding unit 150 in FIG. 2, the guiding unit 150a in FIG. 4, the guiding unit 150b in FIG. 6, the guiding unit 150c in FIG. 8, the guiding unit 150d in FIG. 10, the guiding unit 150e in FIG. 11, the guiding unit 150f in FIG. 12 and the guiding unit 150g in FIG. 13.

The illuminating optical unit 210 may be arranged at a side of the apparatus 100 for creating the EUV light. The illuminating optical unit 210 may project the EUV light created from the apparatus 100 for creating the EUV light to a mask M. The mask M may be positioned on a mask stage 230 over the illuminating optical unit 210.

The projecting optical unit 220 may be arranged under the illuminating optical unit 210. The projecting optical unit 220 may project the EUV light reflected from the mask M to a substrate S. The substrate S may be positioned on a substrate stage 240 under the projecting optical unit 220.

Figure 16:
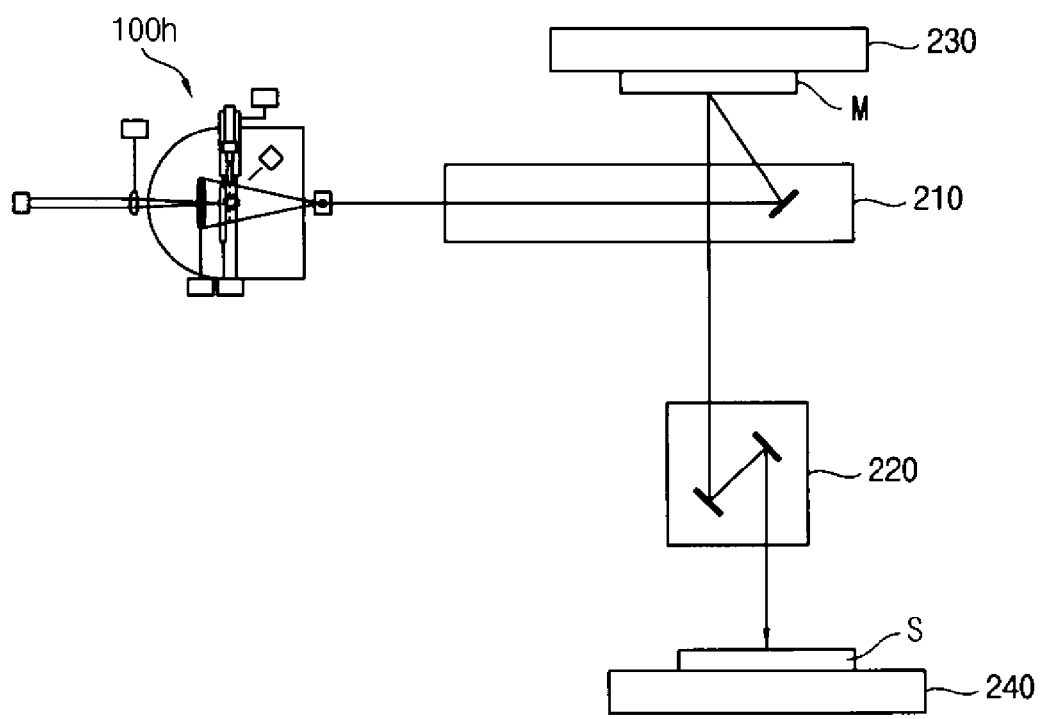
FIG. 16 is a plan view illustrating an exposing apparatus including the apparatus for creating the EUV light of FIG. 14.

FIG. 16 is a plan view illustrating an exposing apparatus including the apparatus 100h for creating the EUV light of FIG. 14.

An exposing apparatus 200a may include elements substantially the same as those of the exposing apparatus 200 in FIG. 15. Thus, the same reference numerals may refer to the same elements and any further illustrations with respect to the same elements may be omitted herein for brevity.

Referring to FIG. 16, the exposing apparatus 200a of the example embodiment of FIG. 15 may include the apparatus 100h for creating the EUV light, an illuminating optical unit 210 and a projecting optical unit 220.

In example embodiments, the apparatus 100h for creating the EUV light may include elements substantially the same as those of the creating apparatus 100h in FIG. 14. Thus, the same reference numerals may refer to the same elements and any further illustrations with respect to the same elements may be omitted herein for brevity.

The creating apparatus 100h may include any one of the guiding unit 150 in FIG. 2, the guiding unit 150a in FIG. 4, the guiding unit 150b in FIG. 6, the guiding unit 150c in FIG. 8, the guiding unit 150d in FIG. 10, the guiding unit 150e in FIG. 11, the guiding unit 150f in FIG. 12 and the guiding unit 150g in FIG. 13.

Further, other exposing apparatuses having structures different from the exposing apparatuses 200 and 200a may be included within the scope of the present inventive concepts as defined in the claims under conditions that other exposing apparatuses may include the apparatuses for creating the EUV light of example embodiments.

Semiconductor Device

Semiconductor devices manufactured using the exposing apparatus 200 in FIG. 15 may be included in the scope of the present inventive concepts as defined in the claims. When the semiconductor device is manufactured by creating the EUV light using any one of the apparatuses for creating the EUV light in example embodiments, as described above, forming a photoresist pattern using the exposing apparatus 200 and the EUV light, and forming a pattern using the photoresist pattern as an etch mask, the semiconductor devices may be included in the scope of the present inventive concepts.

Further, semiconductor devices manufactured using the exposing apparatus 200a in FIG. 16 may be included in the scope of the present inventive concepts as defined in the claims. When the semiconductor device is manufactured by creating the EUV light using any one of the apparatuses for creating the EUV light in example embodiments, as described above, forming a photoresist pattern using the exposing apparatus 200a and the EUV light, and forming a pattern using the photoresist pattern as an etch mask, the semiconductor devices may be included in the scope of the present inventive concepts.

For example, the semiconductor devices may include volatile memory device, non-volatile memory devices, or the like. Further, other electronic devices such as display devices, which may be manufactured using the exposing apparatuses including the apparatuses for creating the EUV light in the example embodiments described above, may also be included in the scope of the present inventive concepts. The display devices may include a liquid crystal display (LCD) device, a plasma display device, an organic light emitting display (OLED) device or the like.

According to some example embodiments, the gas sprayed from the gas-spraying hole of the guiding unit may form the gas curtain configured to surround the flow of the droplet. Thus, the droplet may be accurately guided to the laser irradiation position. Further, the gas curtain may block movements of the particles generated from the droplet, so that the light-concentrating unit may not be contaminated by the movements of the particles. Particularly, because the gas sprayed from the gas-spraying unit may not enter into the gas curtain, turbulence causing shaking of the droplet may not be generated. As a result, the gas sprayed from the gas-spraying unit may have only a function of preventing the movements of the particles toward the light-concentrating unit.

While the inventive concepts have been particularly shown and described with reference to example embodiments thereof, it will be understood that various changes in form and details may be made therein without departing from the spirit and scope of the following claims.

What is claimed is:

1. An apparatus for creating an extreme ultraviolet (EUV) light, the apparatus comprising:
   a droplet-supplying unit supplying a droplet in a first direction from which the EUV light is created;
   a laser-irradiating unit irradiating a laser to the droplet supplied from the droplet-supplying unit to create the EUV light;
   a light-concentrating unit concentrating the EUV light created by the laser-irradiating unit;
   a guiding unit guiding the droplet to a position where the laser is irradiated, the guiding unit having at least one gas-spraying hole that sprays a gas to a space between the droplet-supplying unit and the laser-irradiating unit to form a gas curtain to surround the droplet; and
   a gas-spraying unit for spraying a gas from the light-concentrating unit to the droplet in a second direction substantially perpendicular to the first direction to prevent particles generated from the droplet from being adhered to the light-concentrating unit,
   wherein the pressure of the gas sprayed from the gas-spraying unit at the gas curtain is lower than the pressure of the gas sprayed from the gas-spraying hole.

2. The apparatus of claim 1, wherein the guiding unit has a passageway through which the droplet passes.

3. The apparatus of claim 2, wherein the gas-spraying hole is along the guiding unit such that the gas curtain surrounds the passageway.

4. The apparatus of claim 3, wherein the gas-spraying hole has a plurality of holes spaced apart from each other by a uniform interval.

5. The apparatus of claim 3, wherein the gas-spraying hole has a single hole extended in a lengthwise direction of the guiding unit.

6. The apparatus of claim 2, wherein the guiding unit has a shape configured to fully surround the passageway.

7. The apparatus of claim 6, wherein the guiding unit has one of a rectangular frame cross-section and an annular cross-section.

8. The apparatus of claim 2, wherein the guiding unit has a shape configured to partially surround the passageway for exposing a portion of the passageway that is opposite the light-concentrating unit.

9. The apparatus of claim 1, wherein the guiding unit and the droplet-supplying unit are substantially parallel to each other, and the droplet-supplying unit and the laser-irradiating unit are substantially perpendicular to each other.

10. The apparatus of claim 9, wherein the light-concentrating unit is arranged between the laser-irradiating unit and the position where the laser is irradiated.

11. An apparatus for creating an extreme ultraviolet (EUV) light, the apparatus comprising:
a droplet-supplying unit supplying a droplet in a first direction;
a laser-irradiating unit irradiating a laser in a second direction substantially perpendicular to the first direction to the droplet to create the EUV light;
a light-concentrating unit between the laser-irradiating unit and a position where the laser is irradiated to concentrate the EUV light;
a gas-spraying unit spraying a first gas from the light-concentrating unit in the second direction substantially perpendicular to the first direction_to prevent particles generated from the droplet from being adhered to the light-concentrating unit; and
a guiding unit having a passageway and at least one gas-spraying hole, the passageway in the guiding unit guiding the droplet to the laser irradiation position, and the gas-spraying hole arranged around the passageway to spray a second gas in the first direction for forming a gas curtain to block off the first gas from a flow of the droplet
wherein the pressure of the first gas at the gas curtain is lower than the pressure of the second gas.

12. The apparatus of claim 11, wherein the guiding unit has a shape configured to fully surround the passageway.

13. The apparatus of claim 11, wherein the guiding unit has a shape configured to partially surround the passageway for exposing a portion of the passageway that is opposite to the light-concentrating unit.

14. An exposing apparatus comprising:
an apparatus creating an extreme ultraviolet (EUV) light;
an illuminating optical unit projecting the EUV light to a mask; and
a projecting optical unit projecting the EUV light reflected from the mask to a substrate,
wherein the apparatus creating the EUV light comprises:
a droplet-supplying unit supplying a droplet in a first direction;
a laser-irradiating unit irradiating a laser to the droplet to create the EUV light;
a light-concentrating unit concentrating the EUV light;
a guiding unit guiding the droplet to a position where the laser is irradiated, the guiding unit having at least one gas-spraying hole for spraying a gas to form a gas curtain configured to block off external environments from a flow of the droplet; and
a gas-spraying unit for spraying a gas from the light-concentrating unit to the droplet in a second direction substantially perpendicular to the first direction to prevent particles generated from the droplet from being adhered to the light-concentrating unit, wherein the pressure of the gas sprayed from the gas-spraying unit at the gas curtain is lower than the pressure of the gas sprayed from the gas-spraying hole.

15. The apparatus of claim 14, further comprising a mask stage arranged over the illuminating optical unit to support the mask.

16. The apparatus of claim 14, further comprising a substrate stage arranged under the projecting optical unit to support the substrate.

17. An exposing apparatus comprising:
an apparatus creating an extreme ultraviolet (EUV) light;
an illuminating optical unit projecting the EUV light to a mask; and
a projecting optical unit projecting the EUV light reflected from the mask to a substrate,
wherein the apparatus creating the EUV light comprises:
a droplet-supplying unit supplying a droplet in a first direction;
a laser-irradiating unit irradiating a laser in a second direction substantially perpendicular to the first direction to the droplet to create the EUV light;
a light-concentrating unit between the laser-irradiating unit and a position where the laser is irradiated to concentrate the EUV light;
a gas-spraying unit spraying a first gas from the light-concentrating unit in the second direction substantially perpendicular to the first direction to prevent particles generated from the droplet from being adhered to the light-concentrating unit; and
a guiding unit having a passageway and at least one gas-spraying hole, the passageway in the guiding unit guiding the droplet to the laser irradiation position, and the gas-spraying hole arranged around the passageway to spray a second gas in the first direction for forming a gas curtain to block off the first gas from a flow of the droplet,
wherein the pressure of the first gas at the gas curtain is lower than the pressure of the second gas.

18. The apparatus of claim 17, further comprising a mask stage over the illuminating optical unit to support the mask.

19. The apparatus of claim 17, further comprising a substrate stage under the projecting optical unit to support the substrate.

20. An apparatus for creating an extreme ultraviolet (EUV) light, the apparatus comprising:
a droplet-supplying unit supplying a droplet in a first direction;
a laser-irradiating unit irradiating a laser in a second direction to the droplet to create the EUV light;
a light-concentrating unit concentrating the EUV light;
a guiding unit having a passageway and at least one gas-spraying hole, the passageway in the guiding unit guiding the droplet to a position where the laser irradiated, and the gas-spraying hole at least partially surrounding the passageway to spray a gas in the first direction forming a gas curtain to surround the droplet; and
a gas-spraying unit for spraying a gas from the light-concentrating unit to the droplet in the second direction to prevent particles generated from the droplet from being adhered to the light-concentrating unit,
wherein the second direction is substantially perpendicular to the first direction, and
wherein the pressure of the gas sprayed from the gas-spraying unit at the gas curtain is lower than the pressure of the gas sprayed from the gas-spraying hole.

21. The apparatus of claim 20, wherein the gas-spraying hole has a plurality of holes spaced apart from each other by a uniform interval.

22. The apparatus of claim 20, wherein the gas-spraying hole has a single hole extended in a lengthwise direction of the guiding unit.

* * * * *